US006239916B1

(12) United States Patent
Stange

(10) Patent No.: US 6,239,916 B1
(45) Date of Patent: May 29, 2001

(54) OPTICAL TRANSMITTER DEVICE

(75) Inventor: Herwig Stange, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/500,282

(22) Filed: Feb. 8, 2000

Related U.S. Application Data

(63) Continuation of application No. PCT/DE98/02139, filed on Jul. 28, 1998.

(30) Foreign Application Priority Data

Aug. 8, 1997 (DE) .............................................. 197 35 925

(51) Int. Cl.⁷ .......................... G02B 27/14; H01L 27/00; G01J 1/42; H01S 3/13
(52) U.S. Cl. .................. 359/629; 250/208.1; 250/208.2; 372/29
(58) Field of Search .............................. 250/208.2, 208.6; 359/528, 629, 639; 372/29, 30, 31

(56) References Cited

U.S. PATENT DOCUMENTS 5,191,204 * 3/1993 Dickson et al. .................. 250/208.2
5,247,167 * 9/1993 Bargerhuff et al. ............... 250/208.1
5,448,536   9/1995 MuranishI et al. .................... 369/19
5,801,402 * 9/1998 Shin ....................................... 257/80
5,809,050 * 9/1998 Baldwin et al. ........................ 372/43

FOREIGN PATENT DOCUMENTS 0 786 838 A2   7/1997 (EP) ............................... H01S/3/025
0 786 839 A1   7/1997 (EP) ............................... H01S/3/085
196 01 955 A1   7/1997 (DE) ................................ G02B/6/42

OTHER PUBLICATIONS

International Patent Application WO 95/18479 (Hibbs–Brenner), dated Jul. 6, 1995.

* cited by examiner

Primary Examiner—Georgia Epps
Assistant Examiner—David N. Spector
(74) Attorney, Agent, or Firm—Herbert L. Lerner; Laurence A. Greenberg; Werner H. Stemer

(57) ABSTRACT

The useful beam component of the radiation emitted vertically by an optical transmitter passes via a lens body to the coupling zone of an optical coupling partner. A component of the emitted radiation strikes a reception zone of a monitor unit. The reflected component likewise traverses the lens body, and is reflected toward the reception zone at the boundary surface thereof on the coupling zone side.

16 Claims, 3 Drawing Sheets

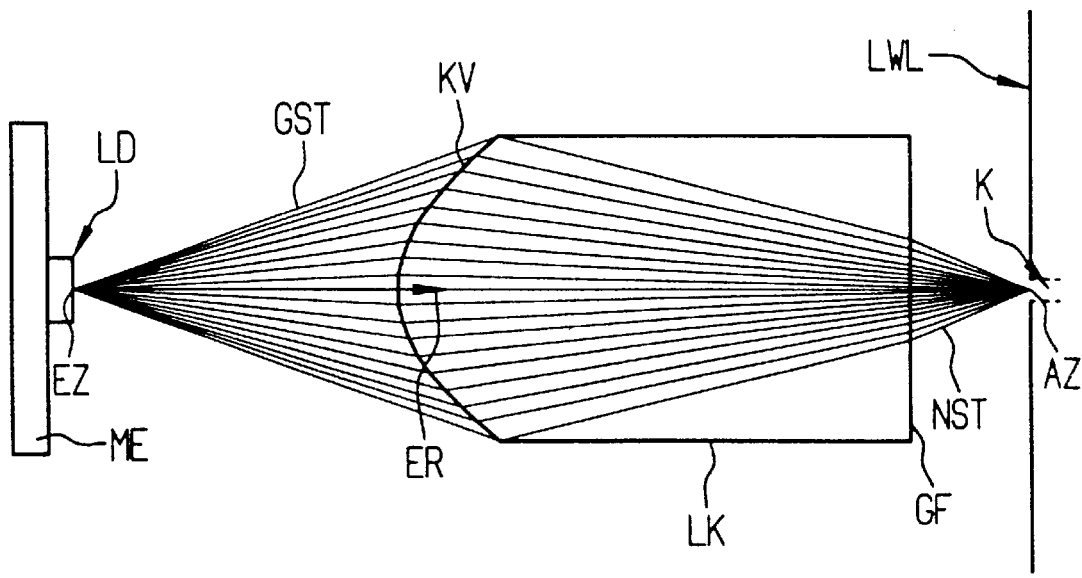
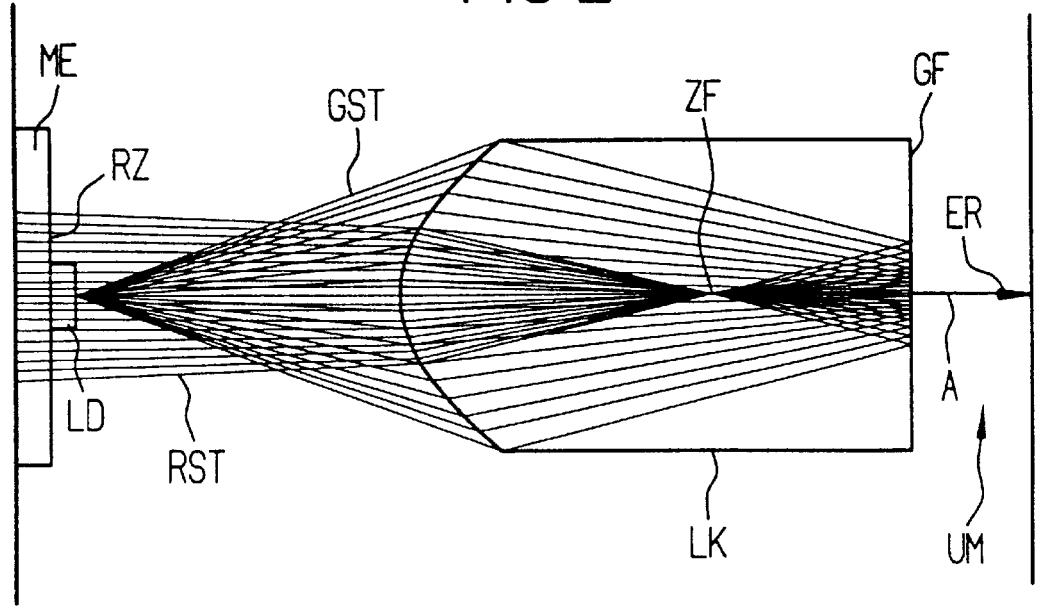

OPTICAL TRANSMITTER DEVICE

CROSS-REFERENCE TO RELATED APPLICATION

This is a continuation of copending International Application PCT/DE98/02139, filed Jul. 28, 1998, which designated the United States.

BACKGROUND OF THE INVENTION

1. Field of the Invention

The invention lies in the field of light-emitting transmitting devices, in particular for purposes of optical data transmission, which are equipped with a so-called monitor unit for the purpose of power control. Specifically, it is desirable for many applications for the output power of a transmitter, which are usually lasers, to be kept as constant as possible—independently, for example, of temperature fluctuations and aging effects. In conventional edge-emitting or side-emitting lasers it is comparatively unproblematic to have a lateral arrangement of a monitor unit, because the monitor unit can be arranged to face the laser side or edge not provided for outputting useful radiation. The (lost) radiation emerging on this side is thus used for control purposes.

Recent developments and progress in production engineering have increasingly rendered possible the economic production of so-called vertically emitting transmitters (VCSEL=vertical cavity surface emitting laser). These transmitters, however, likewise require a control unit with a monitoring device if there is a high demand placed on the quality of a constant laser output power.

With regard to this problem, the introductory text of the international publication WO 95/18479 describes a basic design in which a fraction of the radiation emitted by a transmitter (VCSEL) with a vertically emitting emission zone is directed via a beam splitter onto a monitor unit in the form of a photodetector (photodiode). The output signal of the photodetector is applied to a control circuit which, in accordance with the photodetector output signal, influences the drive current of the laser in such a way that a desired transmitting output power is achieved. That design is relatively complex.

Against that background, WO 95/18479 describes an optical transmitting device in which a vertically emitting laser (VCSEL) has an integrated photodetector which evaluates radiation emerging at the underside of the laser. That design is also comparatively complicated and assumes an integral design of transmitter and monitor unit. It is therefore not possible for vertically emitting optical transmitters to be fitted subsequently or optionally with a monitor unit.

A further transmitting device is known from U.S. Pat. No. 5,809,050 (European patent application EP 0 786 838 A2). In that prior art transmitting device (FIG. 4E), provision is made for the purpose of implementing an integrated controlled laser light source of a vertically emitting laser (VCSEL) as an optical transmitter which has only a single emission zone emitting light vertically. Also provided is a monitor unit with an optically sensitive reception zone for controlling the power of the optical transmitter. A beam splitter which on the transmitter side splits up the emitted radiation into a fraction and a remaining part, is arranged between a coupling zone, which can be formed, for example, by an optical conductor connector receptacle, on the one hand, and the emission zone and reception zone on the other hand. The remaining part is output as useful radiation toward the coupling zone, while the fraction passes to the reception zone.

SUMMARY OF THE INVENTION

It is therefore the object of the invention to create efficient coupling between an optical transmitter with a vertically emitting emission zone and the optically sensitive reception zone of a monitor unit, formation of the reflected radiation being rendered possible with only a small number of individual components, and in a compact design.

With the above and other objects in view there is provided, in accordance with the invention, an optical transmitting device, comprising:

an optical transmitter with a vertically emitting emission zone;

a monitor unit with an optically sensitive reception zone;

a lens body disposed between the emission zone and a coupling zone of a coupling partner, the lens body having a coupling zone side proximal to the coupling partner;

the emission zone emitting radiation into the lens body including a first radiation component traversing the lens body and striking the coupling zone, and a second radiation component reflecting at the coupling zone side and striking the reception zone of the monitor unit.

The above-noted objects of the invention are thus satisfied by the optical transmitting device having then optical transmitter with a vertically emitting emission zone, having a monitor unit with an optically sensitive reception zone and having a lens body. The lens body is arranged, on the one hand, between the emission zone and the reception zone and, on the other hand, a coupling zone of a coupling partner. There passes, via the lens body, a radiation component that strikes the coupling zone and a radiation component of the radiation reflected on the coupling zone side and striking the reception zone.

A first essential advantage of the transmitting device according to the invention consists in that the lens body has the double function both of coupling light into the coupling zone or coupling surface of the coupling partner, and of forming the radiation passing to the monitor unit—that is to say onto the optically sensitive surface thereof. Since these two functions are fulfilled by a single component, the transmitting device according to the invention can advantageously be designed with few components and in an extremely compact fashion. The reflection of the radiation component which is to be retroreflected onto the monitor unit can also be effected in principle by a reflecting element provided between the lens body and coupling zone.

However, in relation to this aspect a particularly preferred embodiment of the invention provides that a boundary surface on the coupling zone side reflects the component of the radiation toward the reception zone. Here, with its boundary surface on the coupling zone side, the lens body takes over a further function—specifically, that of a reflector—and thereby contributes to an even greater reduction in the required number of components, and to a yet more compact design of the transmitting device.

For many practical implementations, the reflection based on the difference between the refractive indices of the lens body and an external medium (for example air) on the coupling side can suffice to reflect an adequate radiation component to the monitor unit. According to a further preferred refinement of the transmitting device according to the invention, the boundary surface is partially silvered in order to ensure particularly favorable and defined reflection conditions. For this purpose, the boundary surface can be provided with a partially transparent reflective coating, and/or part of the boundary surface can be provided with a mirror.

In accordance with an advantageous feature of the invention, which is advantageous as regards the radial space requirement provides that the emission zone is situated inside the reception zone when seen projected against the emission direction.

In accordance with an alternative feature of the invention, which is preferred in terms of design and production engineering, provides that the emission zone and the reception zone are situated next to one another when seen projected against the emission direction.

In accordance with another feature of the invention, it is possible to implement a particularly compact design and a defined expansion of the radiation component applied to the reception zone by virtue of the fact that the radiation component reflected toward the reception zone has an intermediate focus. With regard to the physical size, the lens body geometry can preferably be designed in such a way that the intermediate focus is located in the lens body material.

In accordance with a concomitant feature of the invention, the boundary surface on the coupling zone side has the shape of a conical envelope. Consequently, it is advantageously possible to achieve symmetrical launching in relation to the Z axis (emission direction), and to irradiate an annular reception zone whose surface is not covered by the optical transmitter.

Other features which are considered as characteristic for the invention are set forth in the appended claims.

Although the invention is illustrated and described herein as embodied in an optical transmitting device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 and 2 are diagrammatic views of the beam paths of a first transmitting device;

DESCRIPTION OF THE PREFERRED EMBODIMENTS

Figure 3:
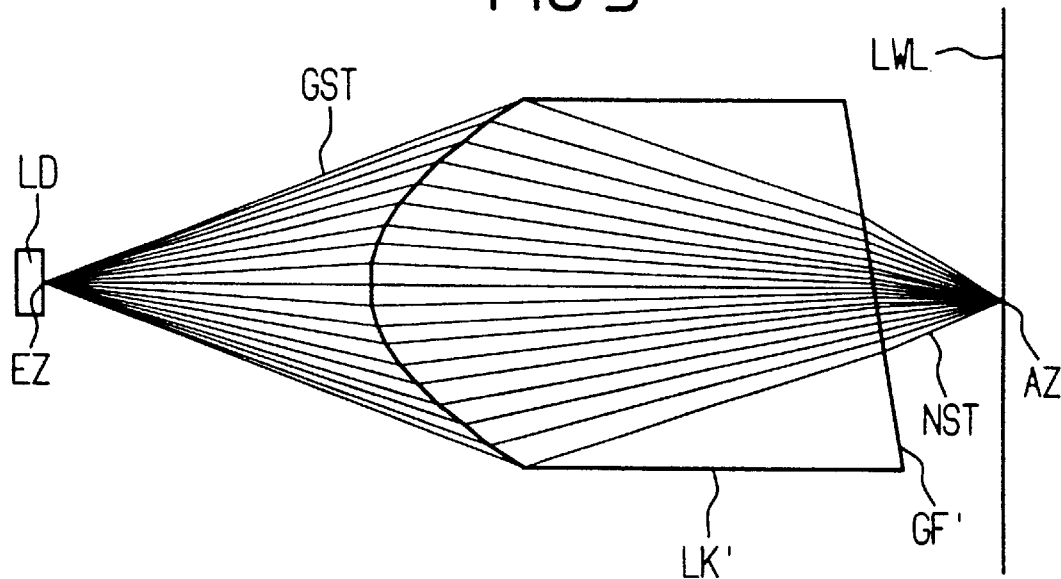
FIGS. 3 and 4 are diagrammatic views of the beam paths of a second transmitting device.

Referring now to the figures of the drawing in detail and first, particularly, to FIG. 1 thereof, there is seen a beam path of a component NST of useful radiation which emerges from an optical transmitter LD. The optical transmitter LD of the exemplary embodiment is a vertically emitting laser (VCSEL) with an emission zone EZ. The laser emits perpendicular to the zone EZ. As explained in more detail below, in addition to the predominant useful radiation component NST, the total radiation GST of the transmitter LD comprises a component RST (FIG. 2) which is retroreflected onto the side of the transmitter LD in a desired way via a lens body LK. The useful radiation component NST enters the optically conducting core K of an optical conductor LWL via a coupling zone (end face) AZ. Of course, instead of the optical conductor LWL it is also possible to provide another optical or electrooptical element (transformer element) as coupling partner.

The useful beam path runs at least partially through the lens body LK which has a boundary surface KV of convex shape on the transmitter side—that is to say on the side facing the transmitter LD—and a plane boundary surface GF on the coupling zone side—that is to say on the side facing the coupling partner LWL.

By contrast, in FIG. 2 only the course of that component RST of the total radiation GST is represented which is (retro)reflected in a desired way onto the side of the transmitter LD by means of the lens body LK. The transmitter LD is positioned on a monitor unit ME, specifically such that the emission zone EZ and, in the exemplary embodiment, the overall transmitter LD is situated inside a reception zone RZ of the monitor unit ME when seen projected along the optical axis A and against the emission direction ER. The monitor unit ME serves to control the transmitter LD. The particular objective of the monitor unit ME is to compensate for power variations that are dependent on temperature and/or caused by aging. The boundary surface GF, on the coupling zone side, of the lens body LK is designed in such a way that it retroreflects to the reception zone RZ a component of, for example, 5% of the emitted radiation GST which is small by comparison with the useful radiation NST (FIG. 1).

The component of the radiation to be reflected is dimensioned, inter alia, in accordance with the desired coupling of power into the coupling partner, and the desired application to the monitor unit. For this purpose, the boundary surface GF can be partially silvered by applying to the boundary surface a partially transparent reflective coating. It is also possible to provide on the boundary surface GF a reflective coating (identified G') which is, for example, annular and exposes the center about the optical axis. For many applications, however, the difference between the refractive indices of the lens body LK and the ambient medium UM (for example air) of the boundary surface already suffices to reflect a radiation component RST sufficient for the purposes of transmitter monitoring and transmitter control.

Viewed together, FIGS. 1 and 2 clearly show that both the useful radiation NST and the reflection radiation RST that is reflected for monitoring purposes traverse the lens body LK, which is disposed between the emission zone EZ and the reception zone RZ, on the one hand, and the coupling zone AZ (FIG. 1) on the other hand. The radiation component RST in this case firstly enters the lens body LK through the boundary surface KV on the transmitter side, is reflected at the boundary surface GF on the coupling partner side, and traverses the lens body LK once again and thereafter emerges through the boundary surface KV, experiencing further beam shaping at the boundary surface KV on the transmitter side. In this case, the reflected radiation RST has an intermediate focus ZF inside the lens body material.

Figure 4:
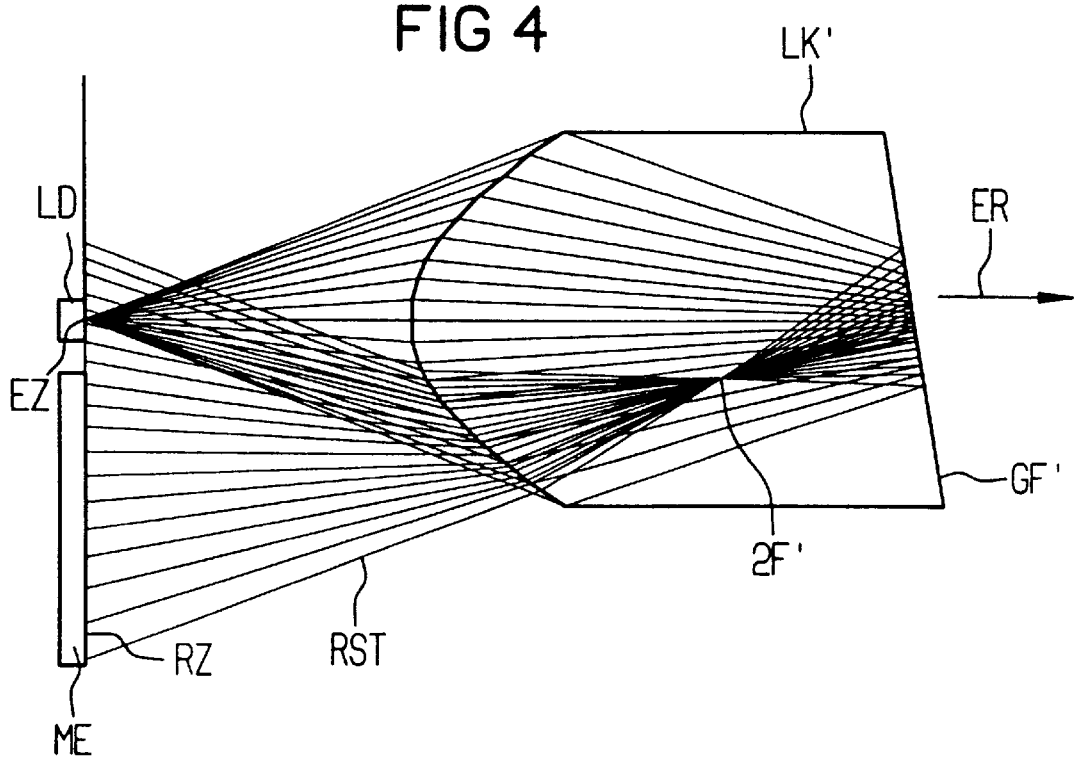

FIGS. 3 and 4 show a variant of the transmitting device according to the invention, which is distinguished, in particular, by the boundary surface GF' on the coupling partner side which is altered by comparison with the configuration shown in FIGS. 1 and 2 (in the following description of the figures, identical or similar elements are identified with the same reference symbols). For reasons of clarity, FIG. 3 shows only that component NST, included in the total radiation GST, of the useful radiation which enters the coupling zone of the optical conductor LWL via a boundary surface GF' inclined with respect to the coupling zone AZ of the optical conductor LWL.

As becomes clear with reference to FIG. 4, which shows, in a mode of representation corresponding to FIG. 2, only the reflected radiation component RST, the inclined configuration of the boundary surface GF' with regard to the reflection of the radiation component RST has the effect that said component is not retroreflected symmetrically with reference to the transmitter LD or its emission zone EZ, but impinges predominantly next to the transmitter LD. Consequently, the monitor unit ME designed as monitor diode is arranged with its reception zone RZ next to the transmitter LD when seen projected against the emission direction ER. In the case of this exemplary embodiment, as well, the component of reflected radiation RST has an intermediate focus ZF' inside the material of the lens body LK'.

Figure 5:
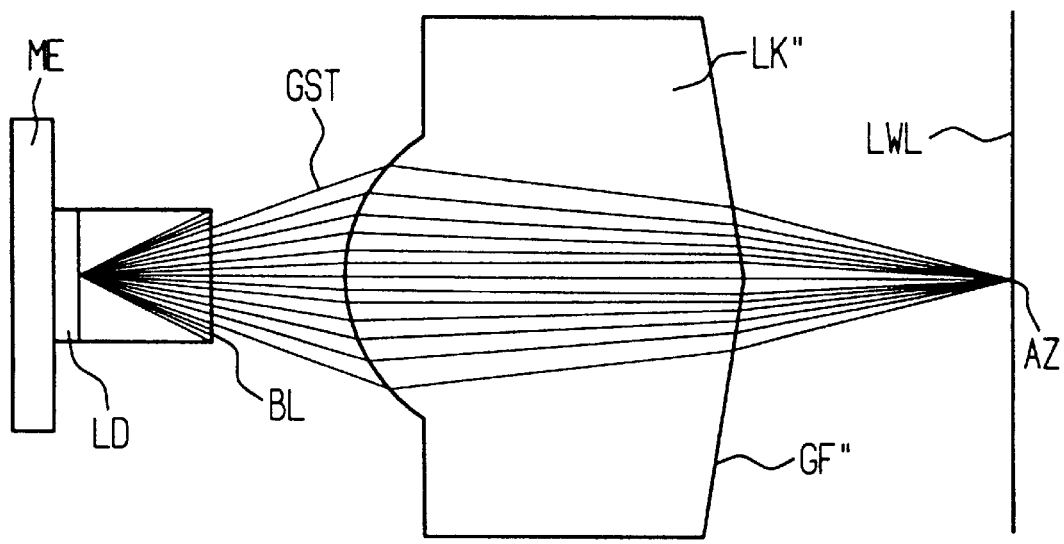
FIGS. 5 and 6 are diagrammatic view of the beam paths of a third transmitting device.
Figure 6:
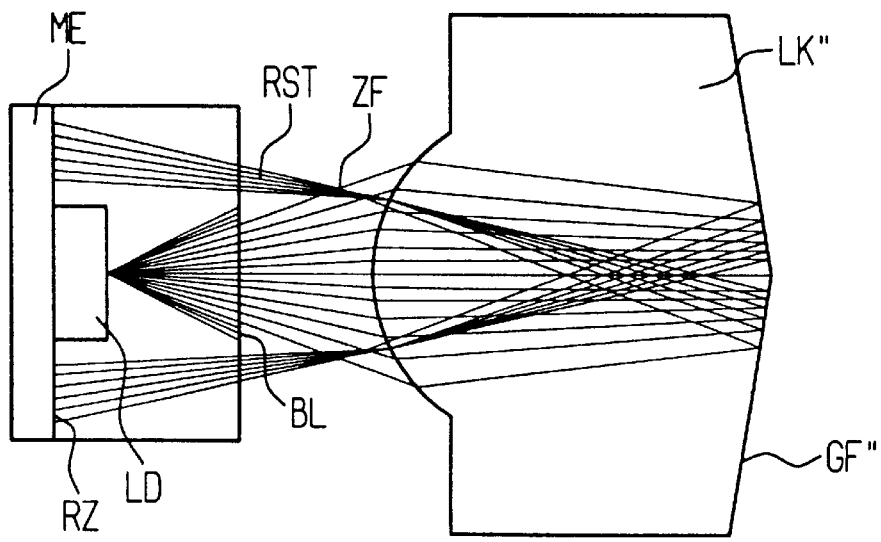

The exemplary embodiment shown in FIGS. 5 and 6, likewise with separation of the radiation components NST, RST, is distinguished by a further modification of the lens body LK" on the side of the coupling zone AZ. In this refinement, the transmitter LD is mounted once again on the monitor unit ME. The boundary surface GF" of the lens body LK" has the shape of a conical envelope, the effects of which emerge, in particular, from the longitudinally symmetrical course (shown in FIG. 6) of the reflected radiation RST. The important component of the total radiation GSTes passes as useful radiation NST" onto the coupling zone AZ of the coupling partner LWL (FIG. 5).

The reflected component RST (FIG. 6) forms an annular intermediate focus ZF outside the lens body LK", and then expands in such a way that the reflected radiation RFT" is applied annularly to the optically sensitive reception zone RZ. This configuration permits a particularly compact design in conjunction with effective application of light to the monitor unit ME.

Common to all the exemplary embodiments is the fact that the reflected radiation is expanded in the region of the monitor unit, and thus, if appropriate, in the region of the transmitter, which is possibly sensitive to reflected radiation (in particular in the case of lasers). Consequently, the radiance of the reflected radiation is reduced such that there is no need to fear damage to the sensor by reflected radiation which partially impinges thereon. In this regard, the exemplary embodiments according to FIGS. 3 to 6 are particularly advantageous, there being no reflective loading of the transmitter at all in the case o f the embodiment in FIGS. 5 and 6. The lens body can be modified by using diffractive instead of refractive optics while maintaining the functions previously described. A more cost-effective implementation is possible, in particular, through the use of plastic lens bodies. The lens bodies can also be multipartite lens elements.

The transmitting device according to the invention is distinguished, inter alia, by the fact that the beam shapings required for monitoring the transmitter power and those for launching the useful radiation are fulfilled by a single component, specifically, the lens body LK. The lens body arranged between the transmitter and monitor unit, on the one hand, and the coupling partner on the other hand, focuses the useful component of the emitted radiation onto the coupling zone, and projects a portion of the emitted radiation onto the monitor device via reflection at the preferably partially silvered boundary surface on the coupling partner side. The transmitting device permits very efficient coupling of the monitor unit in conjunction with a low number of components and a very compact design.

I claim:

1. An optical transmitting device, comprising:

an optical transmitter with a vertically emitting emission zone;

a monitor unit with an optically sensitive reception zone;

a lens body disposed between said emission zone and a coupling zone of a coupling partner, said lens body having a coupling zone side proximal to the coupling partner;

said emission zone emitting radiation into said lens body including a first radiation component traversing said lens body and striking the coupling zone, and a second radiation component reflecting at said coupling zone side and striking said reception zone of said monitor unit.

2. An optical transmitting device, comprising:

an optical transmitter with a vertically emitting emission zone;

a monitor unit with an optically sensitive reception zone;

a lens body disposed between said emission zone and a coupling zone of a coupling partner, said lens body having a coupling zone side proximal to the coupling partner and a boundary surface on said coupling zone side;

said emission zone emitting radiation into said lens body including a first radiation component traversing said lens body and striking the coupling zone, and a second radiation component reflecting at said boundary surface on said coupling zone side and is reflected toward said reception zone.

3. The transmitting device according to claim 2, wherein said boundary surface is partially silvered.

4. The transmitting device according to claim 1, wherein said emission zone is disposed inside said reception zone, as seen projected against an emission direction.

5. The transmitting device according to claim 1, wherein said emission zone and said reception zone are disposed adjacent one another, as seen projected against an emission direction.

6. The transmitting device according to claim 1, wherein the second radiation component reflected toward said reception zone is intermediately focussed at an intermediate focus.

7. The transmitting device according to claim 2, wherein said boundary surface on said coupling zone side is shaped as an envelope of a cone.

8. The transmitting device according to claim 2, wherein said emission zone is disposed inside said reception zone, as seen projected against an emission direction.

9. The transmitting device according to claim 2, wherein said emission zone and said reception zone are disposed adjacent one another, as seen projected against an emission direction.

10. The transmitting device according to claim 2, wherein the second radiation component reflected toward said reception zone is intermediately focussed at an intermediate focus.

11. An optical transmitting device, comprising:

an optical transmitter with a vertically emitting emission zone;

a monitor unit with an optically sensitive reception zone;

a lens body disposed between said emission zone and a coupling zone of a coupling partner, said lens body having a coupling zone side proximal to the coupling partner;

said emission zone emitting radiation into said lens body including a first radiation component traversing said lens body and striking the coupling zone, and a second radiation component reflecting at said coupling zone side and striking said reception zone of said monitor unit, the second radiation component reflected toward said reception zone is intermediately focussed at an intermediate focus.

12. The transmitting device according to claim 11, wherein said lens body is formed with a boundary surface on said coupling zone side, whereat the second radiation component of the radiation is reflected toward said reception zone.

13. The transmitting device according to claim 12, wherein said boundary surface is partially silvered.

14. The transmitting device according to claim 11, wherein said emission zone is disposed inside said reception zone, as seen projected against an emission direction.

15. The transmitting device according to claim 11, wherein said emission zone and said reception zone are disposed adjacent one another, as seen projected against an emission direction.

16. The transmitting device according to claim 12, wherein said boundary surface on said coupling zone side is shaped as an envelope of a cone.

* * * * *